US009585289B2

(12) United States Patent
Ross et al.

(10) Patent No.: US 9,585,289 B2
(45) Date of Patent: Feb. 28, 2017

(54) BUILDING LEVEL DEHUMIDIFICATION AND COOLING

(71) Applicant: Amazon Technologies, Inc., Seattle, WA (US)

(72) Inventors: Peter George Ross, Olympia, WA (US); William Charles Bauerle, Everett, WA (US); Alan Donald Gillooly, Auburn, WA (US); Christopher Alon Goodnow, Haymarket, VA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 15/186,916

(22) Filed: Jun. 20, 2016

(65) Prior Publication Data

US 2016/0302328 A1    Oct. 13, 2016

Related U.S. Application Data

(62) Division of application No. 13/895,597, filed on May 16, 2013, now Pat. No. 9,372,516.

(51) Int. Cl.
*B01D 53/02* (2006.01)
*H05K 7/20* (2006.01)
*G06F 1/20* (2006.01)
*F24F 5/00* (2006.01)

(52) U.S. Cl.
CPC ....... *H05K 7/20718* (2013.01); *F24F 5/0035* (2013.01); *G06F 1/206* (2013.01)

(58) Field of Classification Search
CPC ............ F24F 2203/1084; F24F 3/1423; G06F 1/206; H05K 5/0213; H05K 7/20718; H04L 25/03203; H04L 25/03968
See application file for complete search history.

(56) References Cited

U.S. PATENT DOCUMENTS

| 3,859,818 A | 1/1975 | Goettl |
| 3,880,224 A | 4/1975 | Weil |
| 4,118,945 A | 10/1978 | Boochever et al. |
| 4,446,703 A | 5/1984 | Gilbertson |
| 4,698,979 A | 10/1987 | Mcguigan |
| 6,076,739 A | 6/2000 | Littleford |
| 6,141,986 A | 11/2000 | Koplin |

(Continued)

FOREIGN PATENT DOCUMENTS

| CN | 201129808 | 10/2008 |
| WO | 2010075358 | 7/2010 |

OTHER PUBLICATIONS

International Search Report and Written Opinion from PCT/US 09/69154 mailed Apr. 13, 2010, pp. 1-8.

(Continued)

*Primary Examiner* — Christopher P Jones
(74) *Attorney, Agent, or Firm* — Robert C. Kowert; Meyertons, Hood, Kivlin, Kowert & Goetzel, P.C.

(57) ABSTRACT

A system for cooling heat producing components in a building includes a duct coupled to a room of the building and one or more air moving devices. The duct includes a constricted section. The air moving devices move air through the constricted section of the duct such that water in the air is converted from water vapor to water droplets. The water droplets are carried downstream from the constricted section in a two-phase mixture comprising air and water.

5 Claims, 12 Drawing Sheets

(56) References Cited

U.S. PATENT DOCUMENTS

| | | |
|---|---|---|
| 6,205,797 B1 | 3/2001 | Maeda |
| 6,223,545 B1 | 5/2001 | Kinkel et al. |
| 6,681,584 B1 | 1/2004 | Conner |
| 7,010,392 B2 | 3/2006 | Bash et al. |
| 7,197,433 B2 | 3/2007 | Patel et al. |
| 7,278,273 B1 | 10/2007 | Whitted et al. |
| 7,716,939 B1 | 5/2010 | Morales |
| 8,141,374 B2 | 3/2012 | Hay |
| 8,151,578 B1 | 4/2012 | Morales et al. |
| 8,578,726 B2 | 11/2013 | Hay |
| 8,584,477 B2 | 11/2013 | Hay |
| 8,721,409 B1 | 5/2014 | Morales |
| 9,372,516 B2 | 6/2016 | Ross |
| 2003/0158718 A1 | 8/2003 | Nakagawa et al. |
| 2004/0000152 A1 | 1/2004 | Fischer |
| 2005/0016197 A1 | 1/2005 | Bourne et al. |
| 2005/0228618 A1 | 10/2005 | Patel et al. |
| 2006/0234621 A1 | 10/2006 | Desrochers et al. |
| 2007/0028769 A1 | 2/2007 | Eplee et al. |
| 2007/0101746 A1 | 5/2007 | Schlom et al. |
| 2008/0029250 A1 | 2/2008 | Carlson et al. |
| 2008/0055846 A1 | 3/2008 | Clidaras et al. |
| 2008/0094797 A1 | 4/2008 | Coglitore et al. |
| 2008/0148746 A1 | 6/2008 | Yanik et al. |
| 2008/0259566 A1 | 10/2008 | Fried |
| 2008/0288193 A1 | 11/2008 | Claassen et al. |

OTHER PUBLICATIONS

Office Action from U.S. Appl. No. 13/399,928, mailed Nov. 16, 2012, Jonathan David Hay, pp. 1-8.
Office Action from U.S. Appl. No. 13/399,926, mailed Nov. 19, 2012, Jonathan David Hay, pp. 1-6.
Office Action from U.S. Appl. No. 13/399,926, mailed Mar. 26, 2013, Jonathan David Hay, pp. 1-5.
U.S. Appl. No. 12/163,146, filed Jun. 27, 2008, Osvaldo P. Morales.

BUILDING LEVEL DEHUMIDIFICATION AND COOLING

This application is a divisional of U.S. patent application Ser. No. 13/895,597, filed May 16, 2013, now U.S. Pat. No. 9,372,516, which is hereby incorporated by reference herein in its entirety.

BACKGROUND

Electronic components generate waste heat energy when in use. This heat energy should be removed to mitigate a potential for component overheating and subsequent malfunction. Computer systems typically include a number of such components, or waste heat sources, that include, but are not limited to, printed circuit boards, mass storage devices, power supplies, and processors. For example, one personal computer system may generate 100 watts to 150 watts of waste heat and some larger computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems.

Some known data centers include methods and apparatus configured to facilitate waste heat removal from a plurality of racking systems. Moreover, some known data centers include a plurality of racking systems that have a plurality of configurations that are non-uniform with respect to component density and usage such that each racking system generates waste heat at a non-uniform rate as compared to the remainder of the racking systems. In such data centers, application of uniform heat removal methods and apparatus to such non-uniform waste heat generation sources may not be fully efficient and effective in waste heat removal.

Some data centers use outside air as an important source of cooling air. The characteristics and quality of outside air may vary widely, however, even at a given location. Aside from the significant changes in temperature and humidity that can occur with the change of seasons, environmental quality of the outside air may vary due to a myriad of external factors. These variations over time in availability, cooling capacity, and quality of outside air create challenges in effectively sizing and operating cooling air systems for a data center. For example, a mechanical cooling system that is sized for cooler, drier times of year may fail to provide adequate cooling in hot, humid weather. Conversely, a mechanical cooling system that is sized to provide effective cooling during hot, humid summer months may result in a system that is significantly oversized for cooler, drier times of year.

Figure 1:
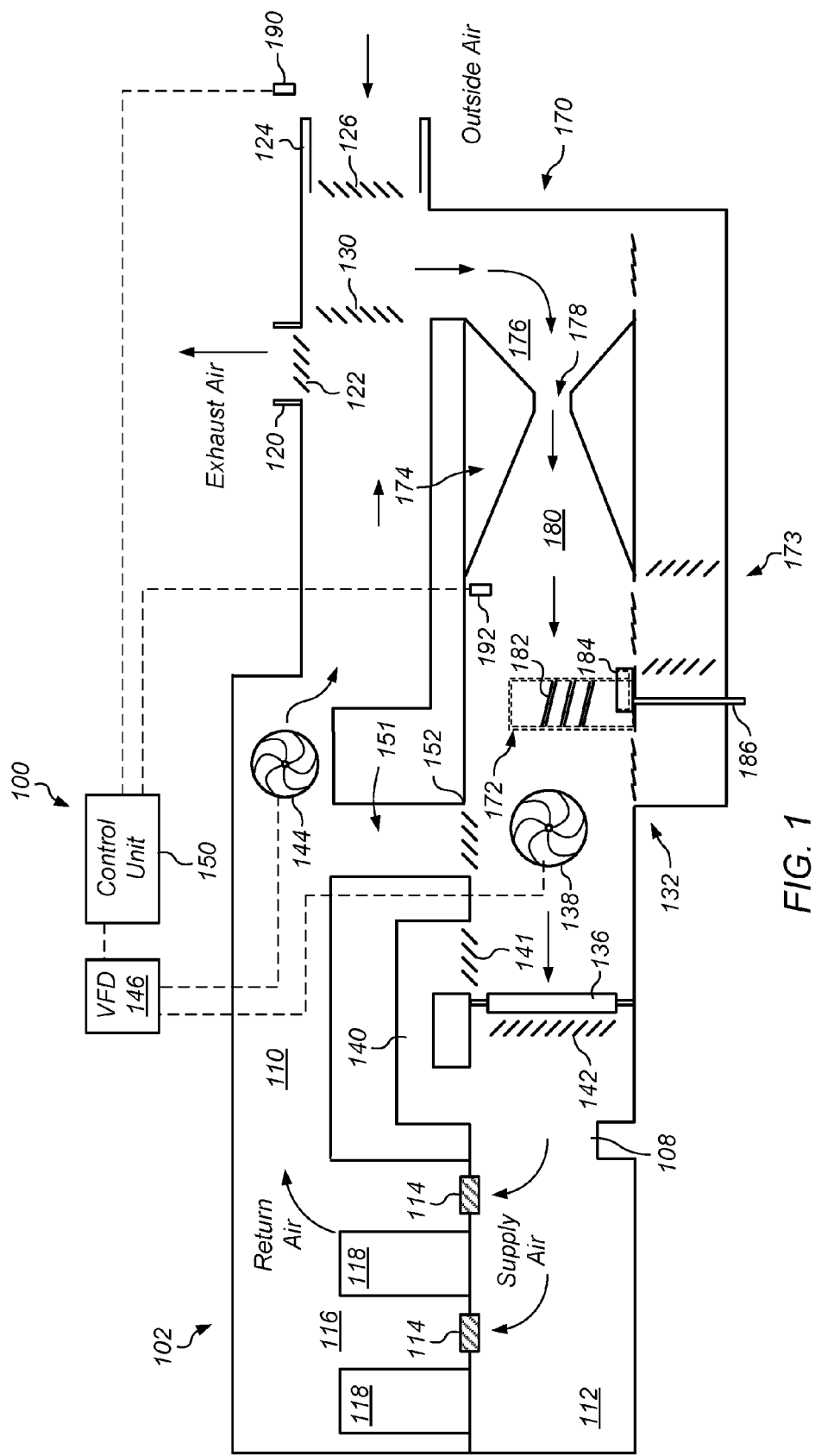
FIG. 1 illustrates one embodiment of a data center including a venturi section in which a two-phase mixture of air and water droplets can be formed.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a system and method for cooling electronic equipment in a data center are disclosed. According to one embodiment, a system for cooling heat producing components in a building includes a duct coupled to a room of the building and one or more air moving devices. The duct includes a venturi section. The air moving devices move air through the venturi section of the duct such that at least a portion of water in the air is converted from water vapor to water droplets. The water droplets are carried downstream from the venturi section in a two-phase mixture including air and water.

According to one embodiment, a system for cooling heat producing components in a building includes a duct coupled to a room of the building and one or more air moving devices. The duct includes a constricted section. The air moving devices move air through the constricted section of the duct such that water in the air is converted from water vapor to water droplets. The water droplets are carried downstream from the constricted section in a two-phase mixture comprising air and water.

According to one embodiment, a method of removing heat from electrical systems in a building includes moving air through a constricted section of a duct such that at least a portion of water in the air is converted from water vapor to water droplets. A two-phase mixture air and the water droplets is moved. Electrical devices are cooled using the two-phase mixture.

According to one embodiment, a data center includes electrical devices and a cooling system. The cooling system includes a desiccant wheel, an evaporative cooling device downstream from the desiccant wheel, an air moving device, and an air flow control device. The air moving devices moves air through the desiccant wheel, the evaporative cooling device, and across heat producing components of the electrical devices. The air flow control device controls the flow of through at least one of the desiccant wheels.

According to one embodiment, a system for removing heat from electrical systems includes a dehumidification device including a desiccant, an evaporative cooling device, and air moving devices, and an air flow control devices. The air moving device moves air through the dehumidification device, the evaporative cooling device, and the electrical systems. The air flow control device controls a rate of flow of through the dehumidification device.

According to one embodiment, a method of removing heat from electrical systems includes controlling a rate of a flow of one or more streams of air. A stream of air is passed across a desiccant to remove water vapor from the air. The stream of air is moved through a wetted media. Heat is removed from electrical systems using the air from the wetted media.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "mechanical cooling" means cooling of air by a process that involves doing mechanical work on at least one fluid, such as occurs in vapor-compression refrigeration systems.

As used herein, "evaporative cooling" means cooling of air by evaporation of liquid.

As used herein, "direct evaporative cooling" means cooling of air by evaporation of liquid directly into a stream of air to be cooled.

As used herein, "adiabatic system" means a system that cools by evaporation of a liquid.

As used herein, "ambient" refers to a condition of outside air at the location of a system or data center. An ambient temperature may be taken, for example, at or near an intake hood of an air handling system.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "damper" includes any device or component that can be moved to control (e.g., increase or decrease) the flow of fluid through a duct or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "position" a damper means to place or leave one or more elements of the damper to achieve desired flow characteristics through the damper, such as open, closed, or partially open. In a system with four air handling sub-systems, positioning the outside air dampers may include opening outside air dampers in one of the sub-systems and keeping outside air dampers closed in the other three sub-systems.

As used herein, a "free cooling mode" includes a mode of operation in which an air handling sub-system pulls air at least partially from an external source (such as air outside a facility) and forces the air to electronic equipment without active chilling in the air-handling sub-system (e.g., fluid flow through the chiller coils in the air handling sub-system is shut off by closing a flow control valve).

As used herein, "room" means a room or a space of a building. A "computer room" means a room in which computer systems, such as rack-mounted servers, are operated.

In some embodiments, a cooling system includes a dehumidification system. In certain embodiments, the dehumidification system is located upstream from other apparatus in the cooling system, such as an evaporative cooling system. A dehumidification system may provide air to a data room and/or cooling apparatus in an air handling sub-system that is relatively dry as compared, for example, to outside air.

In some embodiments, a system with a duct with constricted section in which water vapor is converted into water droplets. The water droplets are carried downstream in a two-phase mixture of air and water. At least a portion of the water droplets are removed from the mixture.

In some embodiments, a system for cooling heat producing components in a building includes a duct with a venturi section in which water vapor in the air is converted into water droplets (for example, mist). The water droplets are carried downstream from the venturi section in a two-phase mixture of air and water. The water droplets may be removed from the mixture.

FIG. 1 is a schematic view of an embodiment of a data center cooling system including a dehumidification system and a direct evaporative cooling section. Cooling system 100 may remove heat from computer systems operating in data center 102. In the embodiment illustrated in FIG. 1, cooling system 100 includes air handling sub-system 104. Air handling sub-system 104 may channel cooling air to data center 102.

The number of air handling sub-systems 104 in cooling system 100 may vary. In some embodiments, cooling system 100 includes many air handling sub-systems 104. In one embodiment, cooling system 100 may include four air handling sub-systems 104. In another embodiment, cooling system 100 includes only one air handling sub-system 104. In facilities with multiple air handling sub-systems and/or multiple data centers, cross-over ducts may be provided (e.g., on the supply side, the return side, or both) to allow cooling air from air handling sub-systems to be distributed and/or redirected within a data center or among data centers. Air handling sub-systems may be commonly controlled, separately controlled, or a combination thereof. In certain embodiments, only a sub-set of the total air handling sub-systems for a data center are provided with outside air vents. For example, half the air handling systems at a data center may have both outside air vents and return air vents, while the other half the air handling systems at a data center have only return air vents.

Each air handling sub-system 104 may be coupled to data center 102 by supply duct 108 and return duct 110. Cooling air may flow from air handling sub-system 104 through supply duct 108 into plenum 112. From plenum 112, cooling air may pass through flow restriction devices 114 into room 116. Cooling air may pass over racks 118. After the air is heated by racks 118, the air may pass through return duct 110. Air may be recirculated through one or more air handling sub-systems or discharged from the system through exhaust vent 120. Exhaust vent 120 includes exhaust damper 122.

Air for cooling system 100 may be drawn from outside air, recirculated air, or a combination of outside air and recirculated air. Air handling sub-system 104 includes outside air vent 124. Outside air vent 124 includes outside air damper 126. Air handling sub-system 104 includes mixing air damper 130.

Cooling system 100 includes dehumidification system 132, evaporative cooler 136, supply fan 138, and return fan 144. Cooling system 100 includes bypass duct 140. Bypass duct 140 may allow for all or a portion of the supply air to bypass evaporative cooler 136. Evaporative cooler bypass damper 141 and evaporative cooler face damper 142 may be selectively positioned to control flow through evaporative cooler 136. Cooling system 100 includes return air bypass 151 and return air bypass damper 152. Supply fan 138 and return fan 144 are coupled to VFDs 146. VFD 146 is coupled to control unit 150.

Dehumidification system 132 includes duct 170, impingement plate system 172, and bypass system 173. Duct 170 includes venturi section 174. Venturi section may be in the form a venturi nozzle. Venturi section 174 includes a constricted section in which the cross-sectional area of the duct is reduced. Venturi section 174 includes converging section 176, reduced section 178, and diverging section 180. Venturi section 174 may be a two-dimensional venturi shape or a three-dimensional venturi shape.

Outside air, return air, or a combination of both may be provided as source air. Source air may be drawn through venturi section 174 by supply fan 138. At reduced section 178, air velocity is increased and pressure is decreased relative to the velocity and pressure of the air coming into venturi section 174. At or near reduced section 178, a portion of the water vapor in the air may come out of saturation, such that water droplets are formed in the air. A multi-phase mixture of air and mist may be formed. In certain embodiments, the temperature at reduced section 178 may drop.

Impingement plate system 172 includes plates 182, drain pan 184 and drainpipe 186. Supply fan 138 draws air from venturi section 174 and across impingement plate system 172. Impingement plate system 172 may serve as a water removal device. As a mixture of air and water droplets from venturi section 174 flows across plates 182, water may accumulate on plates 182 (for example, in the form of condensate). Water on plates may drop from plates 182 and collect in drain pan 184. Water collected in drain pan 184 may be carried away from air handling sub-system 104 in drainpipe 186.

Supply fan 138 moves air that has passed through condensate plate system 172 through evaporative cooler 136. Because some of the water in the source air has been removed, the air supplied to evaporative cooler 136 may be relatively dry. Providing relatively dry air to evaporative cooler 136 may increase effectiveness of the cooling system.

Bypass system 173 includes a duct and a set of dampers that allows air to bypass either or both of venturi section 174 and impingement plate system 172.

In FIG. 1, impingement plate system 172 is shown, for illustrative purposes, as downstream from constricted section 178. A water removal device may nevertheless, in some embodiments, be located at a different location relative to the constricted section of a duct. For example, an impingement plate for collecting water may be located at the narrowest section of a duct (for example, reduced section 178) or in a diverging portion of a duct (for example, diverging section 180). In some embodiments, a water removal device is positioned in a duct to optimize removal of mist from a two-phase mixture of air and mist.

In cooling system 100 illustrated in FIG. 1, dehumidification system 132 can be used to dehumidify air from outside air, recirculated air, or a combination of outside air and recirculated air, depending on the mode of operation of cooling system 100.

Control unit 150 may be programmed to control devices in air handling sub-systems 102 and dehumidification system 132. Control unit 150 is coupled to supply fan 138, return fan 144, outside air damper 126, exhaust damper 122, and mixing air damper 130. Control unit 150 is in data communication with temperature sensors, humidity sensors, and pressures sensors. For example, control unit 150 is in data communication with temperature sensor 190 located near the intake hood of cooling system 100. In one embodiment, control unit 150 is in data communication with sensors 192 at a location downstream from dehumidification system 132.

In one embodiment, all of the air handling sub-systems and dehumidification systems at a data center are controlled with a common control unit. In other embodiments, separate controllers are provided for each air handling sub-system and dehumidification sub-system, or for a subset of the air handling sub-systems and/or dehumidification sub-systems. Devices in air handling sub-systems and dehumidification sub-systems may be controlled automatically, manually, or a combination thereof.

In certain embodiments, control unit 150 includes at least one programmable logic controller. The PLC may, among other things, open and close dampers in air handling system 104 based upon command signals from an operator to channel air flow through data center 102 as necessary for the prevailing operational conditions. Alternatively, the PLC may modulate dampers between fully open and fully closed positions to modulate airflow.

Cooling system 100 also includes a plurality of temperature measurement devices that, in one embodiment, are thermocouples. Alternatively, the temperature measurement devices include, but not be limited to, resistance temperature detectors (RTDs) and any device that facilitate operation of cooling system 100 as described herein.

In the embodiment shown in FIG. 1, air handling subsystem 104 may force air through supply duct 108 into plenum 112. In other embodiments, cooling air may be forced directly into room 116 through a supply duct without going through a plenum. In various embodiments, flow restriction devices 114 may be chosen to control the flow rates and distribution of cooling air among various racks 118 in room 116.

In various embodiments, operation of one or more air handling sub-systems, dehumidification systems, or evaporative cooling devices of a cooling system may be controlled in response to one or more conditions. For example, the controller may be programmed to switch the air source for an air-handling sub-system from return air to outside air when one or more predetermined conditions are met, such as temperature and humidity.

In various embodiments, a cooling system for a data center may be operated in two or more different modes. The mode of operation at any given time may be selected based on characteristics of the outside air, characteristics of air in various locations in the cooling system, and other characteristics prevailing at or near the data center. In various embodiments, the multi-mode cooling system may minimize the amount of energy required to cool a data center. The multi-mode system may allow for a more efficient use of components of a cooling air system, allow for a reduction is size/capacity of one or more elements of the system, reduce operating costs of a cooling system, and/or improve cooling effectiveness (such as through lower operating temperatures of computer systems in the data center).

In some embodiments, cooling of a data center includes pre-dehumidification of source air (such as outside air). In one embodiment, the outside air temperature and/or temperature upstream from the dehumidification system is monitored and the fluid in the dehumidification coils is maintained a few degrees cooler than the measured air temperature. The outside air may be relatively hot and humid air, such may be found in southern Florida during summer months. Air exiting the dehumidification system may be relatively hot and dry. In one embodiment, the mode of cooling may be evaporative cooling. In some embodiments, the mode of cooling may be a hybrid mode that includes mechanical cooling and evaporative cooling. In certain embodiments, the operating parameters of the dehumidification system are controlled to achieve desired characteristics in the supply air to the cooling apparatus. In one embodiment, water in the coils of the dehumidification system is maintained at a temperature that is a few degrees cooler than the outside air and/or incoming air into the dehumidification system. In certain embodiments, air from the data room may be recirculated through a dehumidification system and/or cooling apparatus.

The sequence in which control conditions are assessed may differ from embodiment to embodiment. Control conditions may be monitored over time (continuously or at regular or irregular intervals), and mode switching accomplished based on changes in the conditions. A dehumidification system may be active or inactive in the various modes of operation described herein, either continuous or based on air conditions.

In one embodiment, supply fans in a building are 180,000 cubic feet per minute, QEP-54 manufactured by Greenheck. In one embodiment, return fans in a building are 180,000 cubic feet per minute, ATLI0-40T2 manufactured by Comefri.

Figure 2:
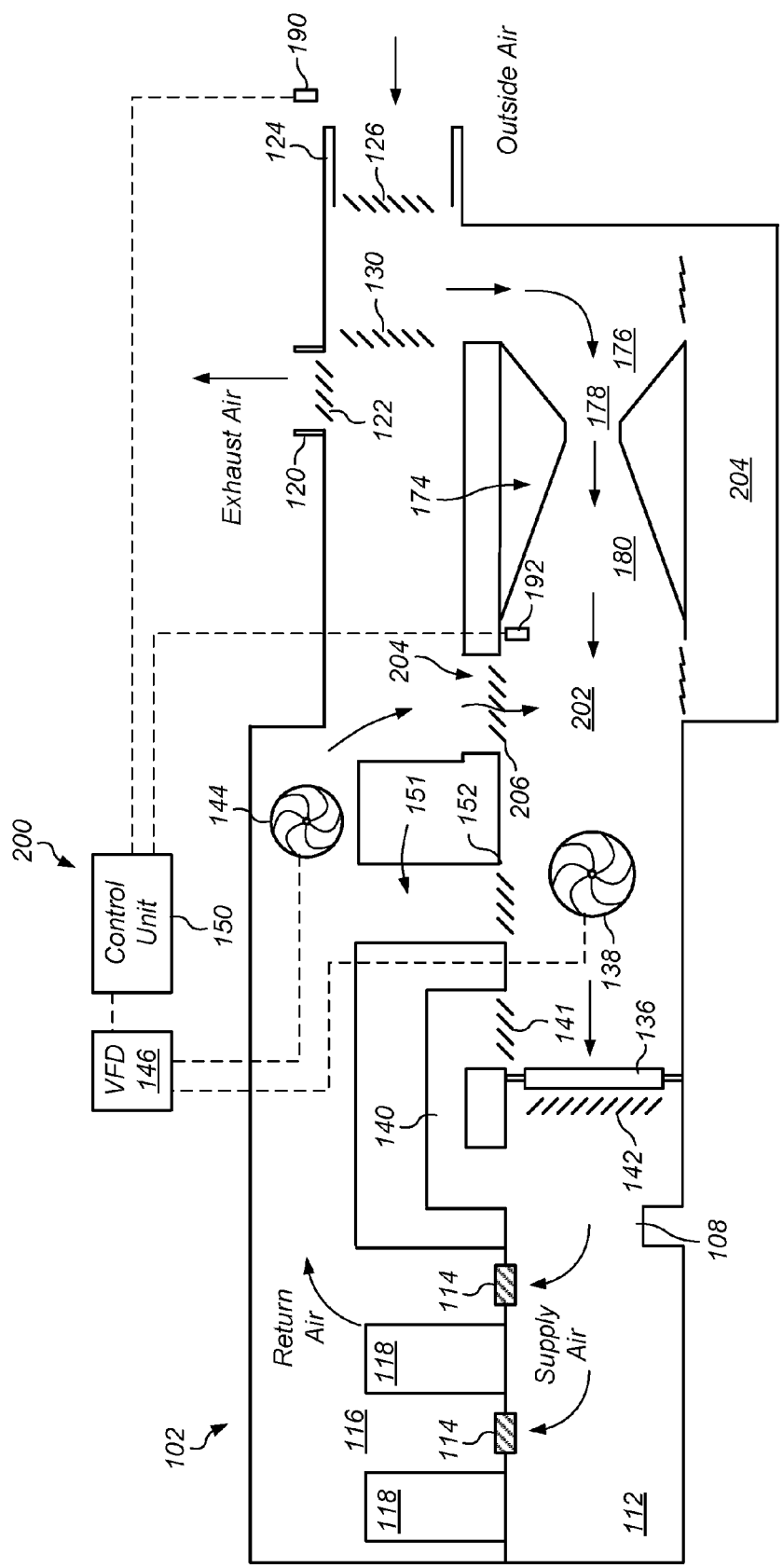
FIG. 2 illustrates one embodiment of a data center including a venturi section and a bypass duct for mixing a two-phase mixture of air and mist with return air.

In some embodiments, a multi-phase mixture of air and liquid water (for example, mist) is mixed with return air from heat producing components in a building. FIG. 2 illustrates one embodiment of a data center including a venturi section and a bypass duct for mixing a two-phase mixture of air and mist with return air. The system shown in FIG. 2 may be similar to that described above relative to FIG. 1. Cooling system 200 includes venturi section 174, mixing region 202, and bypass 204. Mixing region 202 may be selectively placed in fluid communication with return duct 110 by way of vent 206. Dampers 208 may be operated to control the flow of air from return duct 110 to mixing region 202.

Source air may be drawn through venturi section 174 by supply fan 138. At reduced section 178, air velocity is increased and pressure is decreased relative to the velocity and pressure of the air coming into venturi section 174. At or near reduced section 178, a portion of the water vapor in the air may come out of saturation, such that water droplets are formed in the air. The water droplets may be borne in the air in a two-phase mixture of air and mist.

Air from return duct 110 may be introduced into mixing region 202 through vent 206. In mixing region 202, a two-phase mixture of air and mist may mix with air from return duct 110. Air introduced from return duct 110 may have been heated by components in data center 102. Heat from air from return duct 110 may cause a portion of the water droplets in the two-phase mixture to return to saturation. In this manner, return air may be cooled prior to being recycled to data center 102.

In some embodiments, a desiccant system removes water from source air before the air is used for cooling components in a building. In certain embodiments, air that has been dehumidified by a desiccant system is cooled using a direct evaporative cooler before being used to cool the components.

Figure 3:
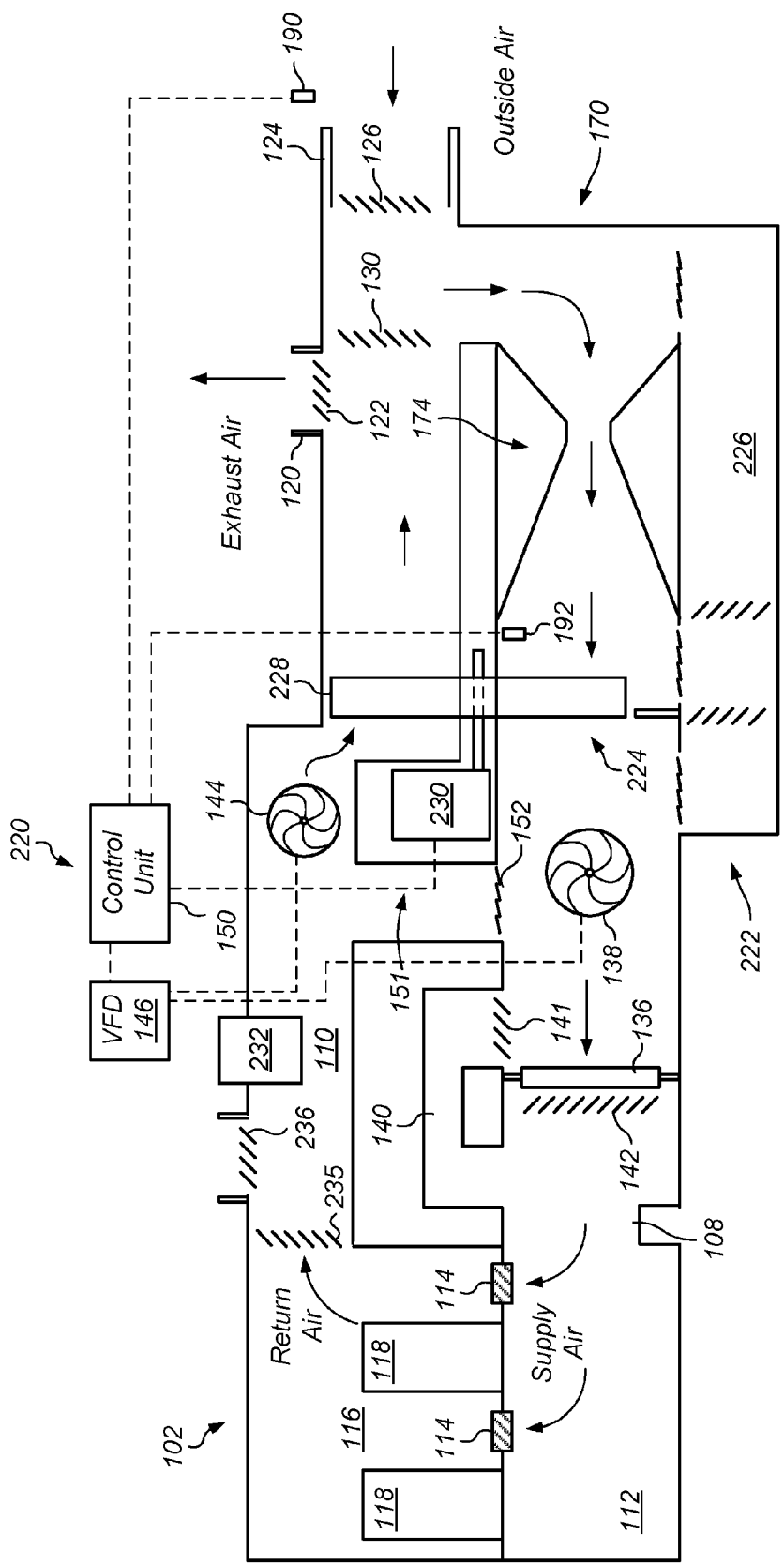
FIG. 3 illustrates one embodiment of a data center including a venturi section and a desiccant wheel that can be operated to dry out a two-phase mixture of air and water droplets.

In some embodiments, a desiccant system is used to remove water from a two-phase mixture of air and mist. FIG. 3 illustrates one embodiment of a data center including a venturi section and a desiccant wheel system that can be operated to dry out a two-phase mixture of air and water droplets. Cooling system 220 includes dehumidification system 222. Dehumidification system 222 includes venturi section 170, desiccant wheel system 224, and bypass 226.

Desiccant wheel system 224 includes desiccant wheel 228 and wheel drive unit 230. Desiccant drive unit 230 may rotate desiccant wheel 228 such that one portion of the desiccant wheel 228 is in the flow of supply air to heat producing components in data center 102, and another portion of desiccant wheel 228 is in the flow of return air from heat producing components in data center 102.

Desiccant wheel 224 includes a desiccant material that removes water from air as the air is drawn through desiccant wheel 228 by supply fan 138. Air flowing through return duct 110 may be moved through a portion of desiccant wheel 228 to reactivate the desiccant material in the wheel. In some embodiments, heater 232 is operated to heat air in return duct 110 before the air passes through the portion of desiccant wheel 228 being reactivated. Heater 232 may be, in various embodiments, a gas heater or an electrical heater.

In some embodiments, air for reactivation of a dessicant device is drawn from outside air. For example, in the embodiment shown in FIG. 3, to use outside air to reactivate dessicant wheel 228, return air damper 235 and return air bypass damper 162 may closed or partially closed. Outside air reactivation damper 236 may be opened to allow air moving device 144 to move air through the portion of dessicant wheel 228 to be reactivated. In some embodiments, reactivation air is a mixture of outside air and return air. For example, both outside air reactivation damper 236 and return air damper 235 may be partially open such that a mixture of air from the computing room and outside is supplied to the reactivation portion of dessicant wheel 228.

Figure 4:
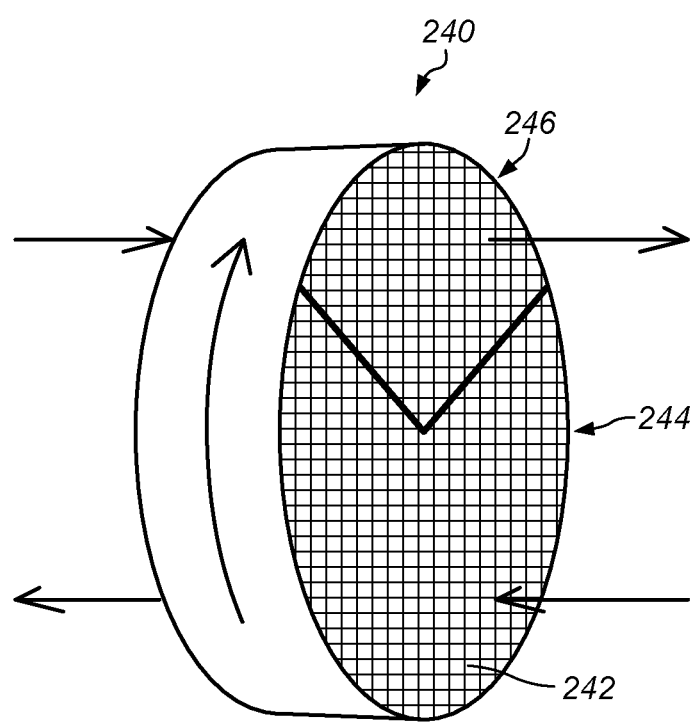
FIG. 4 illustrates one embodiment of a desiccant wheel.

FIG. 4 illustrates one embodiment of a desiccant wheel. Desiccant wheel 240 includes desiccant material 242. Desiccant wheel 240 may be rotated (for example, using a belt drive) such that each portion of desiccant wheel 240 alternately passes through drying zone 244 and reactivation zone 246. A system of ducts (ducts are not shown in FIG. 4 for clarity) may be used to direct the stream of air to be dehumidified into drying zone 244 and to direct a stream of air to reactivate (for example, dry out the desiccant material) into reactivation zone 246. Examples of desiccant material that may be used in a desiccant wheel include silica gel, activated carbon, calcium chloride, or lithium chloride. As desiccant wheel 240 is rotated, each portion of desiccant wheel 240 cycles between a desiccation mode and a reactivation mode.

In some embodiments, a system for removing heat from electrical systems includes one or more desiccant dehumidification devices and an evaporative cooling device. Air flow to the dehumidification devices is controlled using an air flow control device.

In some embodiments, a data center includes electrical devices and a cooling system. The cooling system includes a desiccant wheel and an evaporative cooling device downstream from the desiccant wheel. An air flow control device (for example, a set of louvers) is used to control air flow to the desiccant wheel.

In some embodiments, air enters the unit through a set of louvers. The louvers are motorized to control inlet airflow. From there, the air passes through a desiccant wheel. The desiccant wheel reduces the moisture content (or relative humidity %) of the air. The air passes through the fan compartment and then through an evaporative cooling media, which cools the air. Finally, the air is delivered to the conditioned space.

Figure 5:
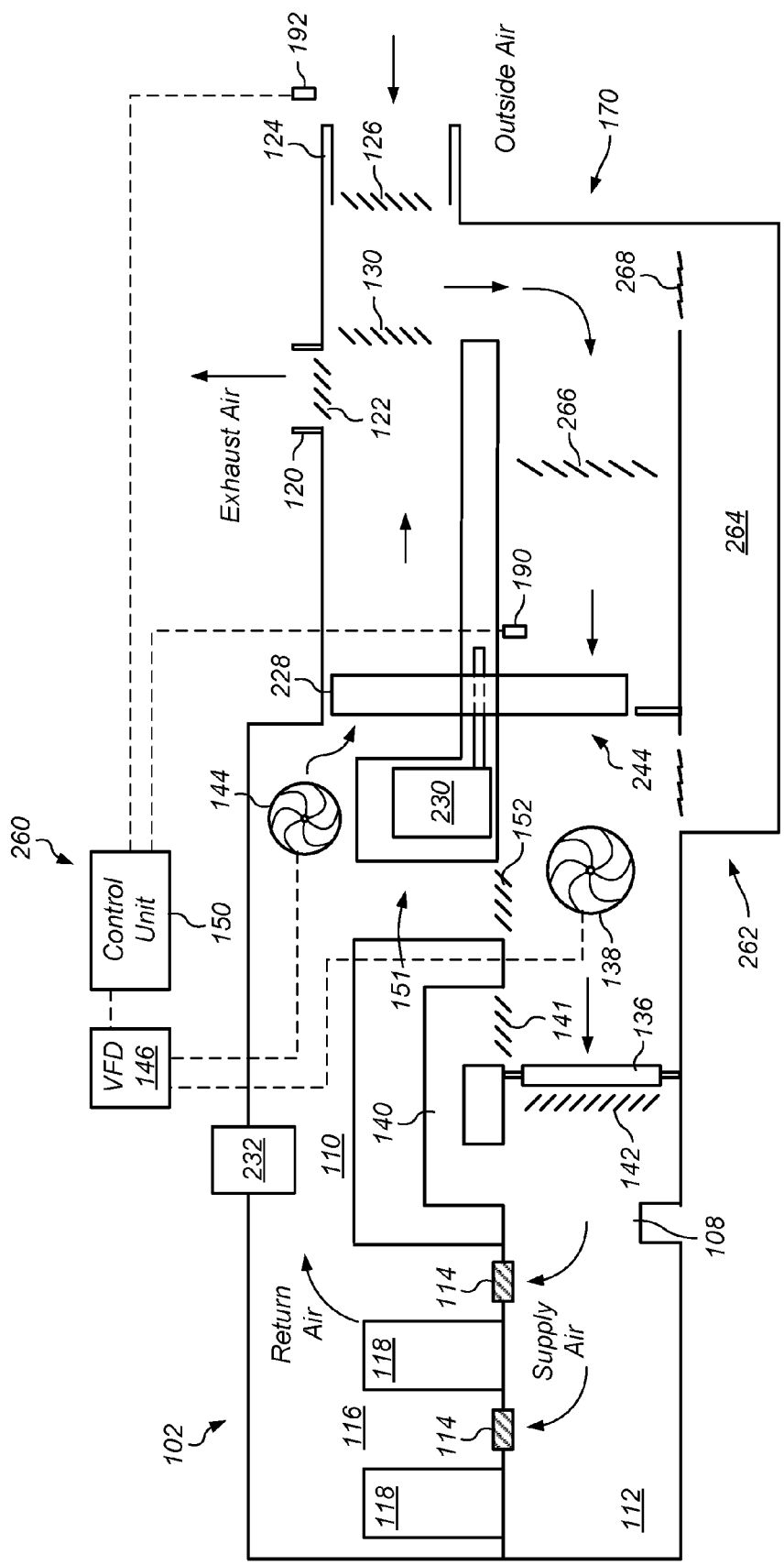
FIG. 5 illustrates one embodiment of data center with a desiccant wheel with dampers to control air flow to the desiccant wheel, and a desiccant bypass duct.

FIG. 5 illustrates one embodiment of data center with a desiccant wheel with dampers to control air flow to the desiccant wheel, and a desiccant bypass duct. Cooling system 260. Cooling system 260 includes dehumidification system 262. Dehumidification system 262 includes desiccant wheel system 234, bypass 264, wheel damper 266, and bypass damper. Wheel damper 266 and bypass damper 268 may be connected to control unit 150. Air flow to desiccant wheel 224 may be controlled using wheel damper 266 and bypass damper 268. For example, when dehumidification is desired prior to air being introduced into evaporative cooler 136, wheel damper 266 may be opened and bypass damper 268 may be closed. If dehumidification is not desired, then wheel damper 266 may be closed and bypass damper 268 may be opened. In some embodiments, the air supplied to evaporative cooler 136 is a mixture of outside air and air that has been dehumidified using one or more of desiccant wheel systems 262.

In some embodiments, multiple desiccant wheels are used to stage the amount of treated air to the space. Using ducted fresh air and damper mechanisms, the amount of air being treated may be increased or decreased while maintaining a constant volume of air delivered to the conditioned space.

Figure 6:
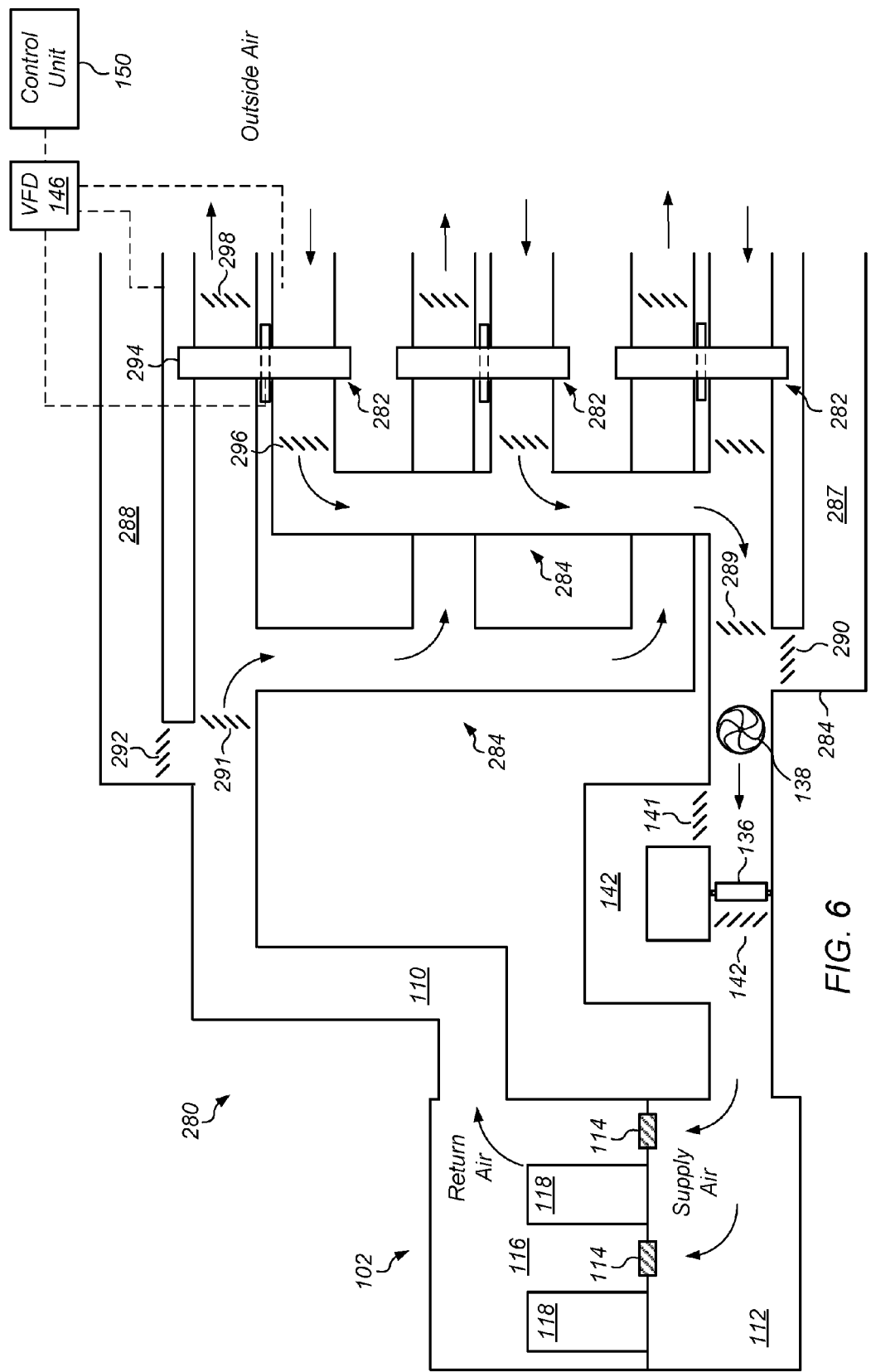
FIG. 6 illustrates one embodiment of data center with multiple desiccant wheels with dampers to control air flow to the desiccant wheels.

FIG. 6 illustrates one embodiment of data center with multiple desiccant wheels with dampers to control air flow to the desiccant wheels. Cooling system 280 includes desiccant wheel systems 282, desiccant duct system 284, reactivation duct system 286, desiccant system bypass 287, and reactivation system bypass 288. Desiccant system main damper 289 and desiccant system bypass damper 290 may be operated to control the source of air to supply fan 138. Reactivation main damper 291 and reactivation bypass damper 292 may be operated to control the flow of air to reactivate desiccant in desiccant wheel systems 282.

Each of desiccant wheel systems 282 includes desiccant wheel system 294, desiccant damper 296, and reactivation damper 298. Desiccant wheel system 294, desiccant damper 296, and reactivation damper 298 may be controlled by control unit 150.

In some embodiments, one or more of desiccant wheel systems 282 are operated to dehumidify air before the air is pass across evaporative cooler 136. The number of desiccant wheel systems that are active, and the operating parameters of each active of desiccant wheel systems, may be based on conditions in the data center or environmental conditions in or outside of the data center. The number of desiccant wheel systems being reactivated may similarly be based on conditions in the data center or environmental conditions in or outside of the data center. For example, if the humidity of outside air is relatively low, all three of desiccant wheel systems 282, may be bypassed using dessicant system bypass 287. If, by contrast, the humidity of outside air is relatively high, all three of desiccant wheel systems 282 may be operated by opening dessicant system dampers 296 and desiccant system main damper 2989. In some embodiments, only a sub-set of desiccant wheel systems 282 are operated (for example, only 1 or 2 of desiccant wheel systems 282). In some embodiments, the air supplied to evaporative cooler 136 is a mixture of outside air and air that has been dehumidified using one or more of desiccant wheel systems 282.

Figure 7:
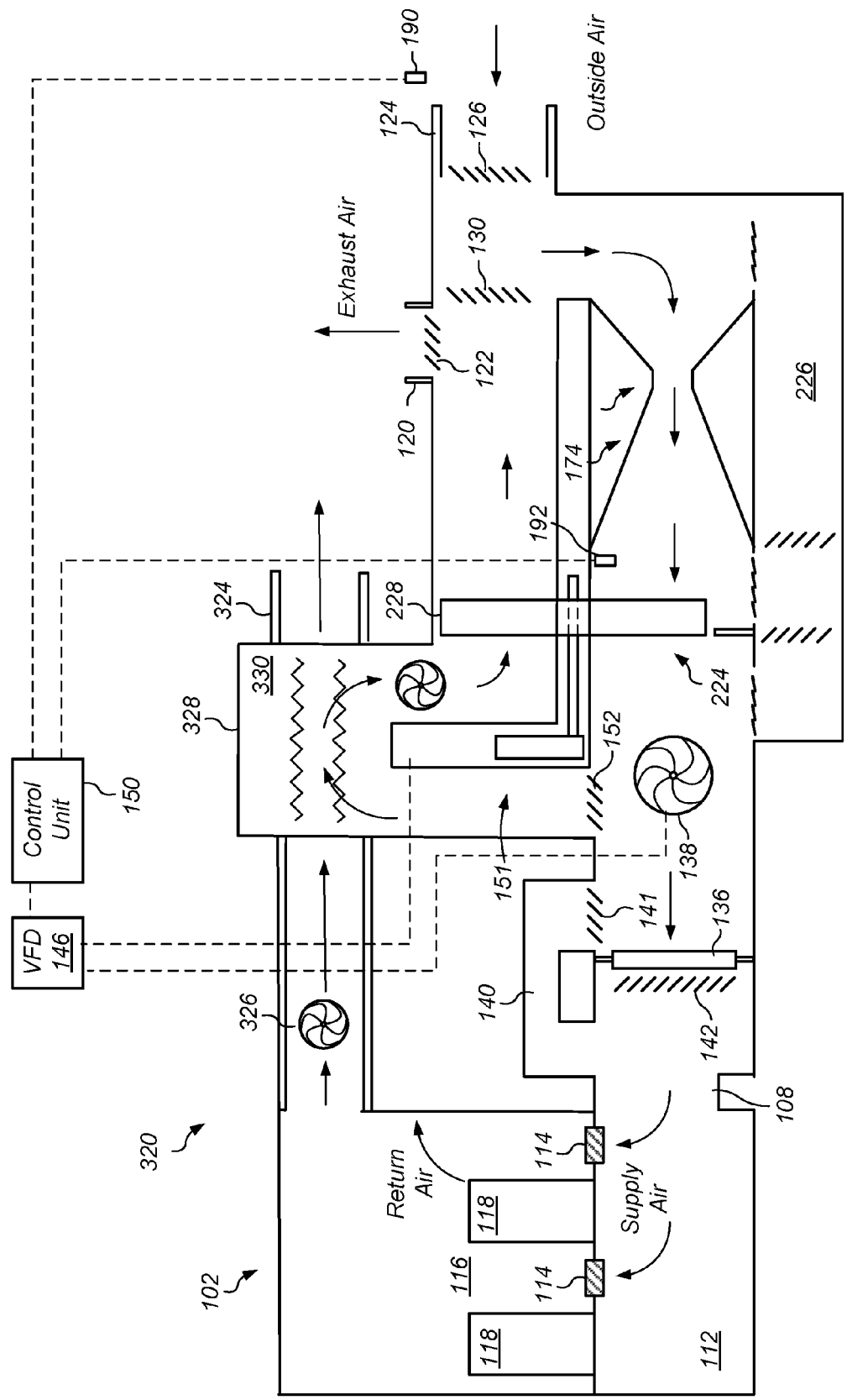
FIG. 7 illustrates a data center with a heat exchanger for transferring heat from electrical loads in the data center to a desiccant reactivation loop.

FIG. 7 illustrates a data center with a heat exchanger for transferring heat from electrical loads in the data center to a desiccant reactivation loop. Cooling system 320 includes dehumidification system 322, computing room exhaust duct 324, computing room exhaust fan 326, and reactivation loop 328. Reactivation loop 328 includes reactivation heat exchanger 330. Reactivation heat exchanger 330 may transfer heat from air passing through computing room exhaust duct 324 to air in reactivation loop 330. The heated air may be forced through the reactivation zone of desiccant wheel 228 to reactivate desiccant in the wheel. In one embodiment, reactivation heat exchanger 330 is a thermal wheel. In another embodiment, reactivation heat exchanger 330 is a plate and frame heat exchanger. In certain embodiments, air in computing room exhaust duct 324 is pre-heated using heater 232 before passing through reactivation heat exchanger 330.

In the embodiment shown in FIG. 7, air for the reactivation loop is drawn from the main supply air duct to the computing room. In certain embodiments, however, air for the reactivation loop may be drawn from outside air instead of, or in addition to, a supply air duct.

Figure 8:
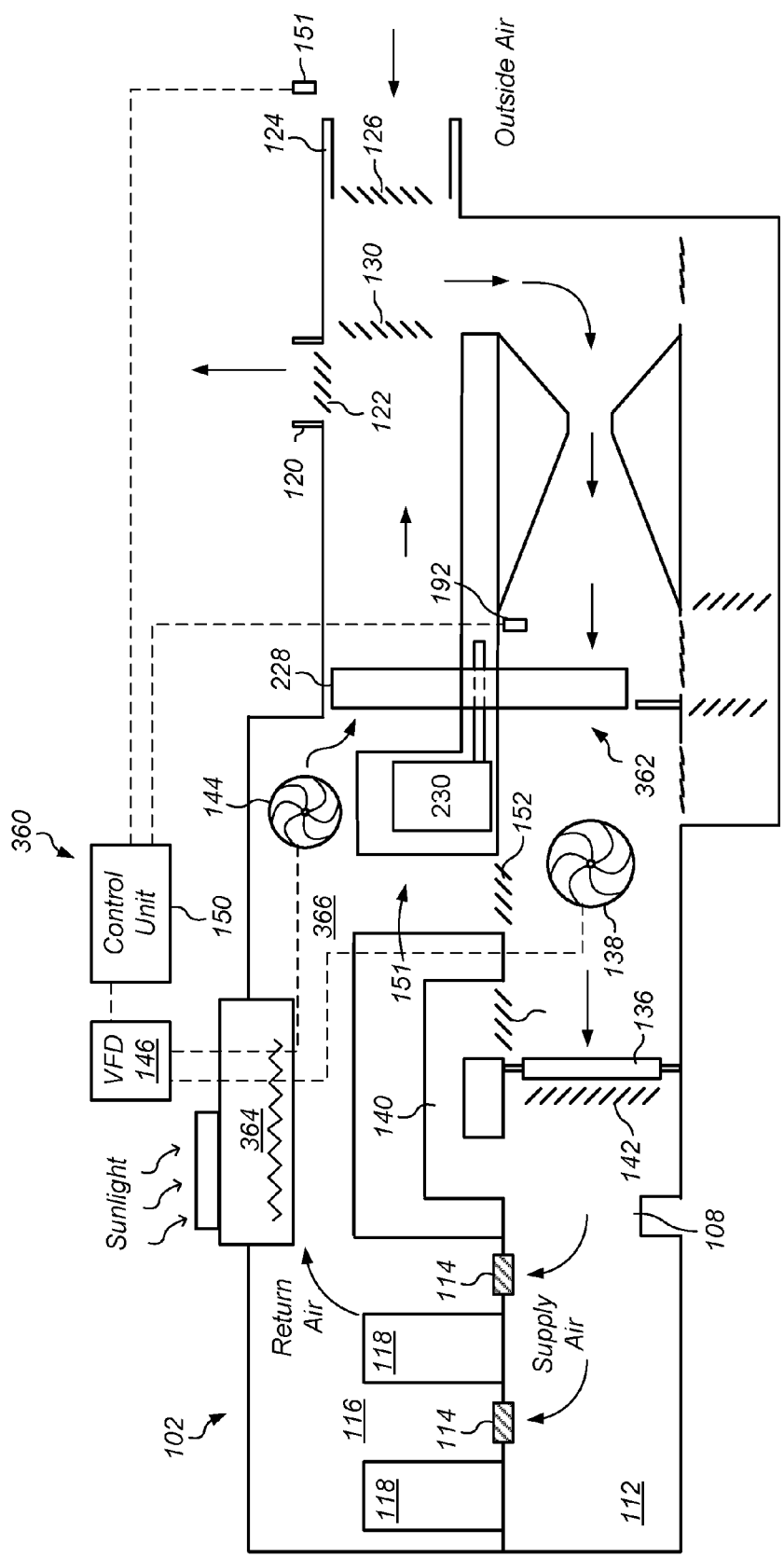
FIG. 8 illustrates a data center with a solar heating system to promote desiccant reactivation.

FIG. 8 illustrates a data center with a solar heating system to promote desiccant reactivation. Cooling system 360 includes dehumidification system 362 and solar heating device 364. Solar heating device 364 may transfer solar heat to air in reactivation loop 366. The heated air may be forced through the reactivation zone of desiccant wheel 228 to reactivate desiccant in the wheel. In certain embodiments, solar heating of air in reactivation loop 366 is supplemented using another heat source, such as an electric heater or a gas heater.

In some embodiments, air for reactivation of a dessicant wheel from process air that is being dehumidified using the dessicant wheel. In one embodiment, air for reactivation of a dessicant wheel for a computing room isolating from air passing through electrical systems in the data center.

Figure 9:
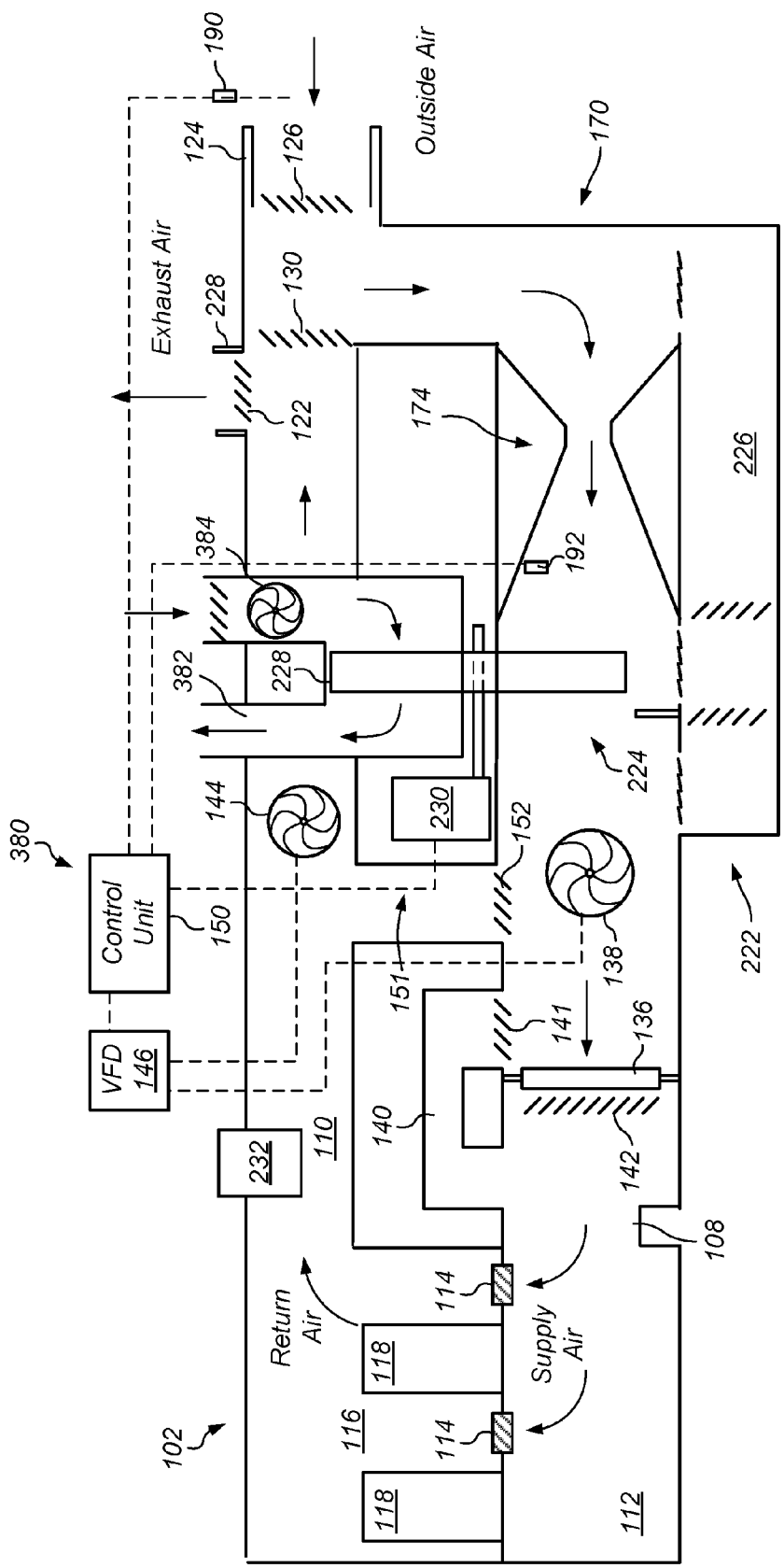
FIG. 9 illustrates one embodiment of a building with a desiccant wheel with a counter-flow arrangement for desiccant reactivation.

In some embodiments, air for reactivating a dessicant wheel is introduced on the same side of the wheel that air to be dehumidified. FIG. 9 illustrates one embodiment of a building with a dessicant wheel with a counter-flow arrangement for dessicant reactivation. System 380 includes reactivation duct system 382. The portion of dessicant wheel 228 to be reactivated passes through reactivation duct system 382. Reactivation air moving device 384 moves air through portion of desiccant wheel 228 that is being reactivated (from right to left in FIG. 9). Reactivation duct system 382 is isolated return duct 110.

In some embodiments, a method of removing heat from electrical systems in a building includes moving air stream through constricted section of a duct to convert some of the water in the air into water droplets.

Figure 10:
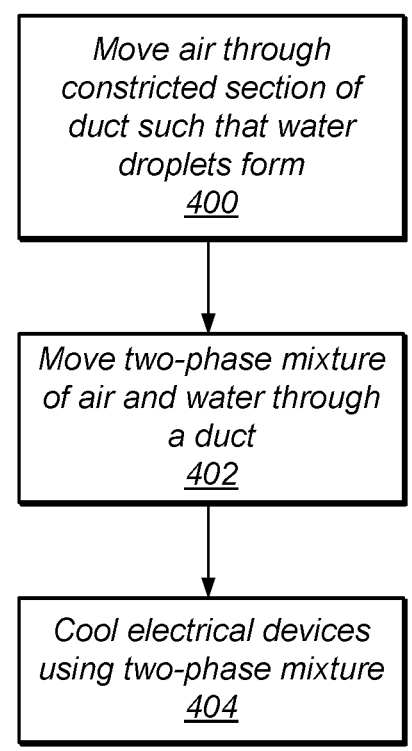
FIG. 10 illustrates one embodiment of cooling electrical systems in a data center using a two-phase mixture of air and water droplets.

FIG. 10 illustrates one embodiment of cooling electrical systems in a data center using a two-phase mixture of air and water droplets. At 400, air is moved through a constricted section of a duct such that at least a portion of water in the air is converted from water vapor to water droplets. In one embodiment, the constricted section is included in a venturi section of the duct. The water vapor may come out of saturation in a region of high velocity and low pressure.

At 402, a two-phase mixture including air and the water droplets is channeled through a duct. In some embodiments, the two-phase mixture includes a mist. The two-phase mixture may be drawn out of a constricted section by an air moving device downstream from the constricted section.

At 404, electrical devices are cooled using the two-phase mixture. In some embodiments, water is removed from the two-phase mixture by a water removal device such as an impingement plate system or a desiccant wheel. The drier air downstream from the water removal device may be passed across an evaporative cooler. Air from the evaporative cooler may be used to cool electrical devices, such as servers in a data center.

In some embodiments, air flow or other operating characteristics in a dehumidification system are controlled based on information from sensors in or outside of a building. Types of sensors that may be used to control dehumidification include temperature sensors, humidity sensors, pressure sensors, and air velocity sensors.

In some embodiments, a method for removing heat from electrical systems includes controlling a flow rate of a stream of air. The stream is moved across a desiccant to remove dehumidify the air. The dehumidified air is moved through a wetted media. Heat is removed from electrical systems using air from the wetted media.

Figure 11:
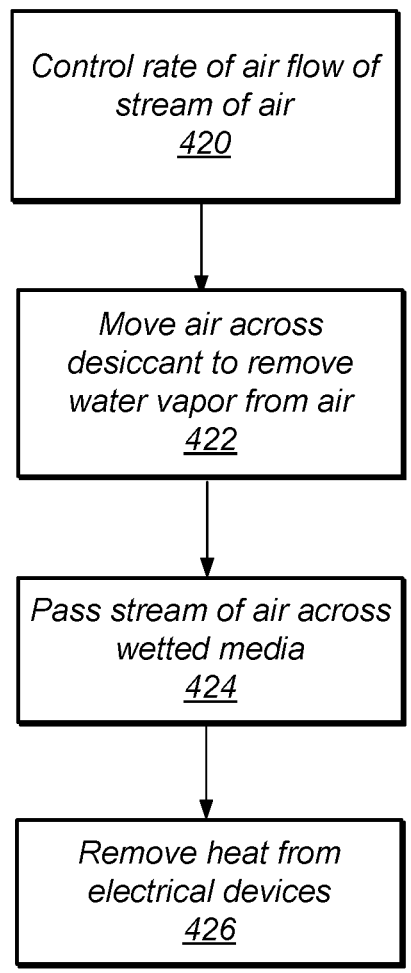
FIG. 11 illustrates one embodiment of cooling electrical systems in a data center with controlled flow of air to a desiccant wheel.

FIG. 11 illustrates one embodiment of cooling electrical systems in a data center with controlled flow of air to a desiccant wheel. At 420, a rate of air flow is controlled in a stream of air.

At 422, one or more of the streams of air is moved across a desiccant to remove water vapor from the air. In some embodiments, the air is passed through a desiccant wheel. In some embodiments, streams of air to two or more desiccant wheels are independently controlled. Air flow to each desiccant wheel may be controlled based on conditions in the data center, outside air, or both. For example, if the source air being introduced into a cooling system is relatively dry, then dampers to one or no desiccant wheels may be opened. If the source air to the cooling system is relatively humid, dampers may be opened to feed air to two or more desiccant wheels.

At 424, the stream of air is passed across or through a wetted media. In some embodiments, the air is passed through an evaporative cooler.

At 426, heat is removed from electrical systems using the air from the wetted media. In some embodiments, the electrical systems are rack-mounted computing devices in a computing room of a data center.

Figure 12:
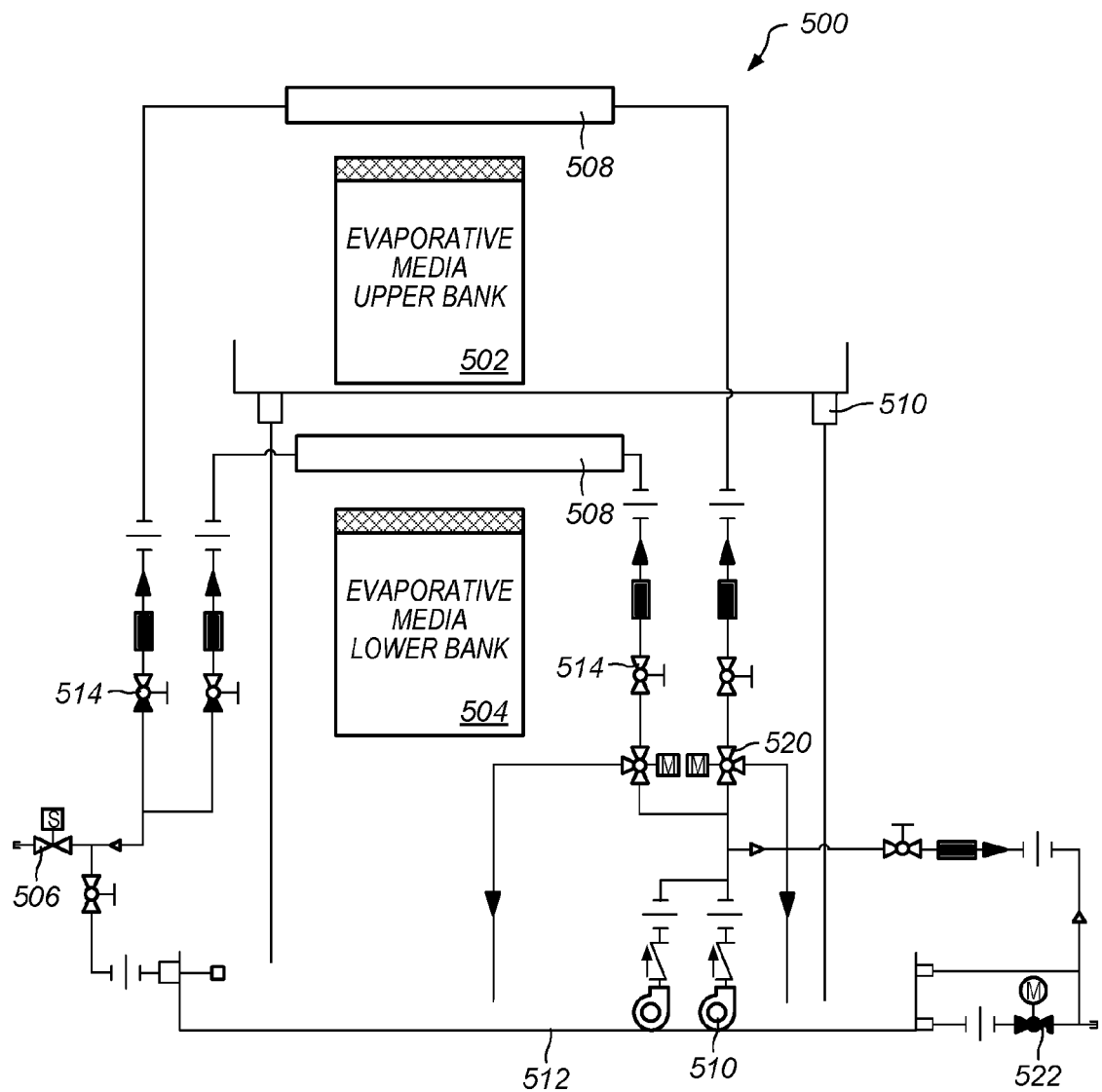
FIG. 12 is a fluid schematic diagram illustrating one embodiment of an evaporative cooling system including upper and lower evaporative media banks.

FIG. 12 is a fluid schematic diagram illustrating one embodiment of an evaporative cooling system including upper and lower evaporative media banks. Evaporative cooling system 500 includes evaporative media upper bank 502 and evaporative media lower bank 504. In one embodiment, the evaporative media is Celdek media manufactured by Munters Corporation. Supply from a domestic water supply is provided through supply valve 506. Water is fed to each of evaporative media upper bank 502 and evaporative media lower bank 504 through distribution manifolds 508. Water may also be supplied to distribution manifolds 508 from bottom sump 512 using pumps 510. Balancing valves 514 may be controlled to balance flow to manifolds 508 and/or water levels in the media. Water may be recirculated to sump 512 using three-way valves 520. Water may be expelled or removed from the system through drain valve 522.

In certain embodiments, an evaporative cooling system may be operated using only one of the evaporative media banks while the flow through the other evaporative media banks is inhibited. Air from the evaporative cooler may be channeled through supply vent 402 to one or more rooms of a data center.

Return air from the data center may be received in a return air chamber. In some embodiments, air in the return air chamber may be exhausted to the outside through exhaust vents. In other embodiments, mixing air dampers may be operated to allow some or all of the return air to mix with incoming outside air in a mixing region. In certain embodiments, air in a return air chamber is forced through a return air bypass. Flow through a return air bypass may be controlled by return air bypass dampers.

In certain embodiments, a cooling system includes a mechanical cooling system in addition, or instead of, an evaporative cooling system. In one embodiment, a heat removal sub-system includes an air-conditioning refrigerant sub-system. In another embodiment, a heat removal sub-system includes a cooling tower sub-system. In still another embodiment, a heat removal sub-system includes a service water sub-system. In certain embodiments, a mechanical cooling system such as an air-conditioning refrigerant system may be in direct heat transfer communication with cooling air in air handling sub-systems, such as air-handling sub-system 104 described above relative to FIG. 1.

In certain embodiments, operation of one or more of subsystems (e.g., CRACs) may be controlled to increase or decrease the total output of the cooling system. In certain embodiments, the number of units switched from normal to free cooling mode may be selected to achieve a desired level of cooling performance. In some embodiments, switching between outside air and return air and/or shut down of the chillers may be programmed to occur in stages.

In the figures described above, connections between the control unit and dampers and fans are not shown for clarity. In various embodiments, however, any or all of the dampers shown in the figures may be automatically controlled (for example, a programmable logic controller.) In addition, any or all of the dampers illustrated in the figures may include an actuator or other mechanism for controlling the position of a damper.

Although in many of the embodiments described herein, non-mechanical cooling with dehumidification is described for illustrative purposes for electrical systems in a data center, dehumidification may, in various embodiments, be performed for other types of buildings and other types of heat producing components. For example, non-mechanical cooling with dehumidification may be used to cool a power plant, a manufacturing plant, a medical care facility, or an office building.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method of removing heat from electrical systems in a building, comprising:
    moving air through a constricted section of a duct such that at least a portion of water in the air is converted from water vapor to water droplets;
    moving a two-phase mixture comprising air and at least a portion of the water droplets; and
    cooling one or more electrical devices using at least a portion of the two-phase mixture.

2. The method of claim 1, further comprising removing at least a portion of the water droplets from the two-phase mixture.

3. The method of claim 2, further comprising evaporating water into the air downstream from the constricted section to cool the air.

4. The method of claim 1, wherein cooling the one or more electrical devices comprises removing heat from computing devices in a data center.

5. The method of claim 1, wherein cooling the one or more electrical devices comprises:
    mixing the two-phase mixture with return air from a room of a building to cool the return air; and
    recirculating at least a portion of the return air to the room.

* * * * *